(12) United States Patent
Signamarcheix et al.

(10) Patent No.: US 8,293,620 B2
(45) Date of Patent: Oct. 23, 2012

(54) METHOD OF MAKING MULTIPLE IMPLANTATIONS IN A SUBSTRATE

(75) Inventors: Thomas Signamarcheix, Grenoble (FR); Chrystel Deguet, Grenoble (FR); Frederic Mazen, Grenoble (FR)

(73) Assignees: Commissariat a l'Energie Atomique et aux Energies Alternatives, Paris (FR); S.O.I. TEC Silicon On Insulator Technologies, Bernin (FR)

( * ) Notice: Subject to any disclaimer, the term of this patent is extended or adjusted under 35 U.S.C. 154(b) by 0 days.

(21) Appl. No.: 13/056,220

(22) PCT Filed: Jul. 7, 2009

(86) PCT No.: PCT/EP2009/058557
§ 371 (c)(1),
(2), (4) Date: Feb. 4, 2011

(87) PCT Pub. No.: WO2010/015470
PCT Pub. Date: Feb. 11, 2010

(65) Prior Publication Data
US 2011/0129988 A1      Jun. 2, 2011

(30) Foreign Application Priority Data
Aug. 6, 2008   (FR) ..................... 08 55439

(51) Int. Cl.
*H01L 21/322* (2006.01)
(52) U.S. Cl. ............... 438/473; 257/E21.568; 438/458; 438/798

(58) Field of Classification Search .................. 438/458, 438/473, 798; 257/E21.568
See application file for complete search history.

(56) References Cited

U.S. PATENT DOCUMENTS

| | | | |
|---|---|---|---|
| 6,756,286 B1 | 6/2004 | Moriceau et al. | |
| 2002/0105033 A1* | 8/2002 | Zhang | 257/353 |
| 2002/0187619 A1 | 12/2002 | Kleinhenz et al. | |
| 2003/0036247 A1* | 2/2003 | Eriksen et al. | 438/455 |
| 2003/0040136 A1 | 2/2003 | Eriksen et al. | |
| 2004/0171196 A1* | 9/2004 | Walitzki | 438/137 |
| 2005/0148163 A1 | 7/2005 | Nguyen et al. | |
| 2006/0063353 A1* | 3/2006 | Akatsu | 438/455 |
| 2007/0148910 A1 | 6/2007 | Neyret et al. | |
| 2008/0286937 A1 | 11/2008 | Mitani | |

FOREIGN PATENT DOCUMENTS

EP         1 780 794 A1      5/2007
(Continued)

OTHER PUBLICATIONS

Office Action issued Aug. 15, 2011, in European Patent Application No. 09 804 532.1.

(Continued)

*Primary Examiner* — William D Coleman
*Assistant Examiner* — Christine Enad
(74) *Attorney, Agent, or Firm* — Oblon, Spivak, McClelland, Maier & Neustadt, L.L.P.

(57) ABSTRACT

A method of implanting atoms and/or ions into a substrate, including: a) a first implantation of ions or atoms at a first depth in the substrate, to form a first implantation plane, b) at least one second implantation of ions or atoms at a second depth in the substrate, which is different from the first depth, to form at least one second implantation plane.

21 Claims, 3 Drawing Sheets

FOREIGN PATENT DOCUMENTS

WO        WO 99/35674       7/1999
WO        WO 2006/032948 A1    3/2006

OTHER PUBLICATIONS

Preliminary Search Report issued Oct. 24, 2008 in France Application No. 710196 (With English Translation of Category of Cited Documents).

Q. Y. Tong, "Principles of wafer bonding", Silicon Wafer Bonding Technology for VLSI and MEMS applications, edited by S. S. Iyer, et al., Chapter 1, INSPEC, 2002, pp. 1-20.

B. Aspar, et al., "Smart Cut©: the technology used for high volume SOI wafer production", Silicon Wafer Bonding Technology for VLSI and MEMS applications, edited by S. S. Iyer, et al., Chapter 3, INSPEC, 2002, pp. 35-52.

* cited by examiner

METHOD OF MAKING MULTIPLE IMPLANTATIONS IN A SUBSTRATE

TECHNICAL FIELD AND PRIOR ART

This invention concerns the field of methods of production semiconductor substrates, of the SOI type in particular.

Such methods are already known but do not enable several substrates to be produced simultaneously while at the same time preserving the sequences used for the transfer steps, in particular those of the "Smart Cut™" technology.

The document WO 99/35674 describes a technique in which successive implantations are carried out, with a view to forming an embrittlement area.

More generally speaking, the problem arises of producing several implantation areas in a single substrate, e.g., a substrate made of a semiconductor material having different depths, with a view to possibly carrying out multiple transfers from this same substrate.

DISCLOSURE OF THE INVENTION

The invention aims to solve this problem, in particular with a view to carrying out successive transfers of various layers of a single substrate.

The invention relates first to a method of implanting atoms and/or ions into a substrate, comprising:

a) a first implantation of ions or atoms at a first depth in the substrate, in order to form a first implantation plane or zone, b) at least one second implantation of ions or atoms at a second depth in the substrate, which is different from the first depth, in order to form at least one second implantation plane or zone.

The invention further relates to a method of transferring at least one layer from a substrate onto at least one first receiving substrate, comprising:

a') a method of implanting atoms and/or ions into the substrate, as described above, thereby forming an implanted substrate with at least two implantation planes or zones, b') assembly of the implanted substrate and the first receiving substrate, c') cleaving or fracturing of the implanted substrate along one of the implantation planes or zones.

The cleaving or fracturing step c') can free, in relation to the first receiving substrate, a portion of the implanted substrate which comprises at least one implantation plane or zone. In other words a portion of the implanted substrate which comprises at least one implantation plane or zone is separated from the first receiving substrate.

This method can further comprise a transfer of said portion of the implanted substrate onto a second receiving substrate.

Then, cleaving or fracturing of said portion of the implanted substrate which remained free (or which was separated) can be carried out along one of the implantation planes or zones thereof.

Prior to step c'), it is likewise possible to assemble the implanted substrate with a second receiving substrate which was assembled with the first receiving substrate.

The cleaving or fracturing step c') can leave on the first receiving substrate a portion of the first receiving substrate, which comprises n (n≧1) implantation planes or zones. After this step c'), n assemblies of the implanted substrate with n successive receiving substrates can then be carried out. Each assembly is followed by a cleavage along one of the cleavage planes or zones remaining in the implanted substrate, and thus enables a portion of this implanted substrate to be transferred onto one of the receiving substrates.

The invention further relates to a method of transferring n layers from a substrate onto n receiving substrates, comprising:

a') a method of implanting atoms and/or ions into the substrate, as described above, thereby forming an implanted substrate with at least two implantation planes or zones, b') n successive assemblies of the implanted substrate, or of a substrate resulting from the initial implanted substrate of which one or more layers has already been transferred, with n receiving substrates, respectively, each assembly, except for the last one, being following by a cleavage or a fracture along one of the implantation planes or zones.

Thus, the invention relates, in particular, to a method of transferring at least two layers from a substrate onto at least one receiving substrate and a second receiving substrate, comprising:

A. an implantation of atoms and/or ions into said substrate, comprising:

a) a first implantation of ions or atoms at a first depth in the substrate, in order to form a first implantation plane or zone, b) at least one second implantation of ions or atoms at a second depth in the substrate, which is different from the first depth, in order to form at least one second implantation plane or zone, thereby forming an implanted substrate with at least two implantation planes or implantation or zones, B. assembly of the implanted substrate and a first receiving substrate, following by cleaving or fracturing of the implanted substrate, which is carried out along one of the implantation planes or implantation zones, this cleavage or fracture leaving, in relation or with respect to the first receiving substrate, a first portion of the implanted substrate free which further comprises at least one implantation plane or implantation zones (said first portion is separated from said first receiving substrate);

C. assembly of said first portion of the implanted substrate, which further comprises at least one implantation plane or implantation zone, and at least one second receiving substrate, followed by cleavage or fracture along one of the implantation planes or implantation zones of this first portion of the implanted substrate.

Step C can leave a second portion of the implanted substrate free, in relation or with respect to the second receiving substrate, a second portion comprising at least one implantation plane (said second portion is separated from said second receiving substrate), and be followed by step D:

D. assembly of said second portion, which further comprises at least one implantation plane or implantation zone, and a third receiving substrate, followed by cleavage along one of the implantation planes or implantation zones of this second portion of the implanted substrate.

An exemplary structure obtained by a method according to the invention is one or more $SiO_2$/Si structures or simply Si, with all of the preceding preparation alternatives.

A plurality of SOI substrates can likewise be produced from a single substrate in which a plurality of embrittlement planes or embrittlement zones have been produced, by transferring onto a plurality of receiving substrates.

Irrespective of the feature of the invention in question, several cleavage planes or cleavage zones are produced simultaneously or successively within the material of a substrate. The two implantation planes or implantation zones can be produced across a single face of this substrate.

The first implantation can be an implantation of a first type of ions, having a first mass, e.g., $H^+$ ions, at least one second implantation being an implantation of a second type of ions, e.g., $H_2^+$, having second mass which is different from the first.

The two types of ions can be obtained:
 by double mass sorting, in an ion implantation device;
 or else without mass sorting of the source;
for this, a simplified ion implanter is preferably used, in which there is no mass sorting of the species. In this case, all of the species present in the plasma will be implanted simultaneously.

According to an alternative, the first and second implantations can each be an implantation of ions. The first ion implantation of a first type of ions is carried out with a first energy output of an implantation device; the second ion implantation of second type of ions is carried out with a second energy, which is different from the first energy output by the same implantation device.

A first charge state of the ions of the first type of ions, which is different from the charge state of the ions of the second type of ions, enables the ions of the first type of ions to be implanted at a different depth from the implantation of the ions of the second type of ions.

According to another alternative, one of the species is atomic and the other is ionic. The atoms can be obtained by neutralizing a first portion of an ion beam, which thus receives a first implantation energy, the second portion of the ion beam being accelerated or decelerated in relation to the first portion of the beam and thus having a different implantation energy from the first implantation energy.

More generally speaking, the beam neutralization phenomenon (or that of energy contamination) can be used in order to implant a species at two depths simultaneously. This phenomenon is due to the neutralization of a portion of the beam between the bending magnet and the acceleration column. The neutralized portion is thus not accelerated (or decelerated) and will therefore be implanted at extraction energy. By controlling the neutralized fraction of the beam prior to the acceleration column, it is thus possible to carry out two simultaneous implantations, the first one at a depth corresponding to the extraction energy and the second to another depth corresponding to the sum of the extraction and acceleration energies. The neutralized beam proportion can be controlled in various ways: by the quality of the vacuum, and/or by introducing a gas and/or via neutralization by means of an electron beam.

Irrespective of the anticipated embodiment, the proportion or dose of elements implanted at the two desired energies (the extraction energies) can be controlled by controlling the quality of the vacuum prior to the acceleration or deceleration column, by regulating the pump power or by introducing a controlled quantity of a gas, or else by beam-charge neutralization of a portion of the species contained in the implantation beam.

Irrespective of the embodiment adopted, additional ions can be implanted at the first or second implantation depth, prior to and/or after step a) and/or step b). It is thus possible to carry out an additional ion input, or to add a species of ions which is different from the ions or atoms of the first or second implantation.

DETAILED DISCLOSURE OF PARTICULAR EMBODIMENTS

Hereinafter, the term substrate is used, however the term "wafer" could be used in place thereof.

Figure 6:
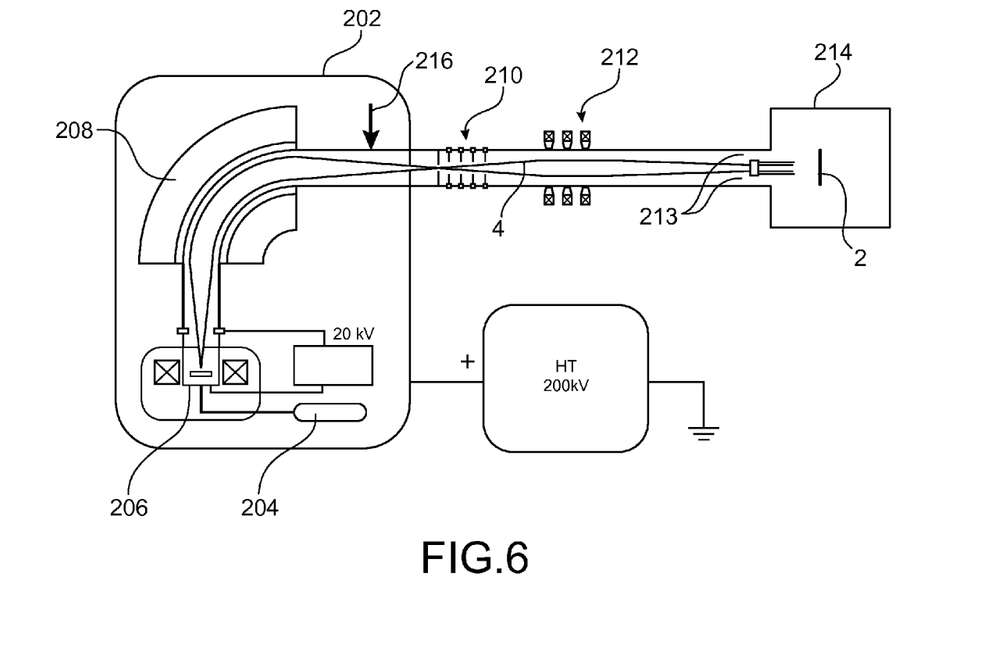
FIG. 6 shows an exemplary device capable of being implemented in order to carry out a method according to the invention.

The invention can be implemented by means of an ion beam-implanting device, which is shown schematically in FIG. 6.

An implanter is piece of equipment which generally comprises an ion source, a beamline enabling the ion to be implanted to be selected and brought to the desired energy on the wafer, a scanning system and a target chamber with dose measurement. Later on, an alternative without ion mass sorting will be disclosed.

More specifically, a source-forming portion 202 comprises a chamber, referred to as the ionization chamber. The species being ionized can be introduced therein in gas form 204. Hereinbelow, the example of a hydrogenated source gas will be provided, however other examples are possible.

The source also comprises means 206 for producing a plasma of the gas introduced into the chamber. For example, in the case of Bernas-type sources, this is a filament (cathode) in which a strong electric current flows, which will thus produce an electron emission. The latter will strike the gas atoms and thereby ionize them and form a plasma.

The source 202 likewise comprises means of forming a magnetic field which enables the plasma to be confined, thereby increasing the ionization efficiency.

At the output of the ionization chamber, means are provided for forming an electrical field (of the order of a few tens of kV), which enables the ions to be extracted.

Mass sorting is next carried out by magnetic means 210 (typically an electromagnet), which causes the ion beam to be deflected. The radius R of curvature of the deflection depends on the nature of the ions:

$$R = M \cdot V / q \cdot B$$

Where M is the mass of the ion, V the velocity thereof, q the charge thereof and B the magnetic field applied.

This step ensures an excellent degree of selectivity of the ionized species present in the incident beam and enables isolation of a single ion mass and a single energy.

Thus purified, the ion beam passes through an acceleration column 210 of the implanter. An acceleration voltage is thereby generated, which is capable of reaching approximately 170 kV to 250 keV on a standard implanter.

Before striking a target 2, the ion beam 4 is focused by focusing means 212 such as a set of quadrupole lenses. Reference 213 designates deflecting plates.

In the case of an implanter without mass sorting, the same comprises a source, extraction means and an acceleration column. All of the ions contained in the plasma are extracted directly and can thus impact the target (the substrate). All of the ions then have the same initial energy, however since the degrees of ionization thereof are different from one another, they will become implanted at different depths.

In every instance, scanning means, which will enable uniform implantation over a certain surface of a sample, can be of three different types, depending on the equipment: electrostatic means, mechanical or mixed means.

In the first case, the beam is subjected to a DC voltage which continuously deflects same, so as to scan the entire surface being implanted.

In the second case (mechanical scanning), a plate can be moved in rotation and/or translation by mechanical means, e.g., by being attached to a drum; the beam then remains fixed.

A third solution can be a combined movement, which associates a component of an electrostatic scanning beam movement on a plate and another component of the plate movement via mechanical means.

The second and third solutions have the advantage of enabling multiple-plate processing. In actual practice, the first and third solutions are used for single-plate processing.

The target chamber 214 is a vacuum enclosure in which a substrate 2 to be implanted across one of the surfaces thereof and a substrate-holder (not shown in the figure) are placed. The chamber comprises a Faraday cage, thereby making it possible to measure the total current I on the plate, which is proportional to the number of ions received, and to control the implantation dose D:

$$D = \frac{1}{q \cdot S} \int_0^\tau I \cdot dt$$

where q is the elementary charge and S is the implanted surface of the substrate. The implantation dose can thus be estimated from the measurement of the current by current-measuring means.

Ion implantation consists in bombarding a material with ions of the desired species, which are accelerated at energies varying from a few kiloelectronvolts (keV) to a few megaelectron volts (MeV), depending on the equipment used. An ion penetrating into a substrate will lose its energy due to collisions with the target atoms, thereby displacing the latter and creating defects along its pathway. At the end of its pathway, the incident ion will become immobilized on a matrix site (interstitial or substitutional). Thus, the ion implantation is characterized by the distribution of the ions, the defects created and the site occupied by the ion in the substrate.

Reference 216 designates a possible controlled gas intake, or means of neutralizing ions of the beam produced prior to passing into the acceleration 210 or deceleration column, possibly at the output of the magnetic means 208.

The ion implantation technique has three major advantages:
- the localized depthwise distribution of the ions implanted in the material is easily controlled by the energy of the ion beam,
- the total quantity of ions produced can be easily measured by the current associated with the intake of the charged particles on the surface of the sample,
- finally, it is possible to exceed the limiting solubility of a species in the material and to introduce species which cannot necessarily be diffused.

In the present description the expressions embrittlement or cleavage or fracture are considered similar. According to the invention, several embrittlement or cleavage planes or cleavage zones (or embrittlement planes or embrittlement zones) are made, at several different depths in a substrate, which, for example, is made of a semiconductor material such as silicon, or Ge or GaN, or a semiconductor material of type III-V, III-VI. The substrate can also be a $SiO_2$/Si type hybrid structure. Hereinafter, the expressions "embrittlement plane" or "cleavage plane" or "weakened plane" are also understood to be similar and also capable of signifying "embrittlement area" (or "embrittlement zone") or "cleavage area" (or "cleavage zone") or "weakened area" (or "weakened zone").

Figure 1:
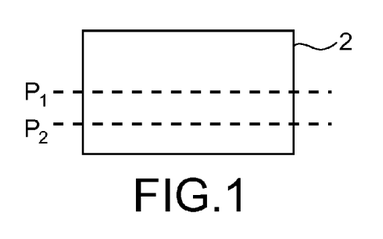
FIG. 1 shows a double-implantation substrate.

FIG. 1 shows an example of such a structure, with two embrittlement planes P1 and P2 at two different depths in the substrate 2.

The plurality of embrittlement planes or areas can be produced by a single implantation step, by simultaneous implantation at various depths in the substrate. Alternatively, two or more successive implantation steps can be carried out, so as to define two or more cleavage planes or areas at two or more depths in the substrate.

Irrespective of the embodiment, the formation of two (n>1, respectively) cleavage planes, at 2 (n>1, respectively) different depths (measured from a single face of the substrate), makes it possible to later carry out two (n, respectively) layer transfers from a single substrate 2.

According to a first embodiment, after production of the plasma and extraction, gas-generated ions of the same energy are subjected to a double mass-sorting system, or a magnet is used which has poor resolution and which allows both species to pass through. It is also possible to not sort by mass.

In the case of a hydrogen source gas, for example, it is $H^+$ and $H_2^+$ ions which are sorted and implanted into the material, for a single initial energy. In this way, via the mechanisms of interaction between the ions and the substrate material, as explained above, the $H^+$ ions are then implanted at a depth $R_2$ with a dose $D_2$, conjointly with the implantation of the $H_2^+$ ions at a depth $R_1$, which is equal to half of $R_2$, with a dose $D_2$. The respective doses $D_2$ and $D_1$ are related to the proportions of $H^+/H_2^+$ ions. The proportions of $H^+$ and $H_2^+$ ions can be controlled by adding elements to the plasma, e.g., water, which promotes the formation of $H^+$ ions.

In the case of implanting two ion species such as $H^+$ and $H_2^+$, two cleavage planes P1 and P2 are thus produced, as shown in FIG. 1.

Figure 2A:
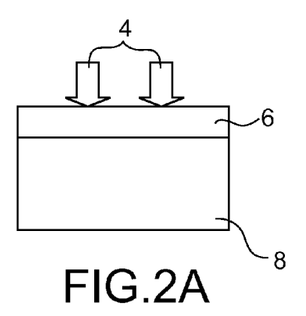
FIGS. 2A and 2B show an exemplary embodiment of a method according to the invention.
Figure 2B:
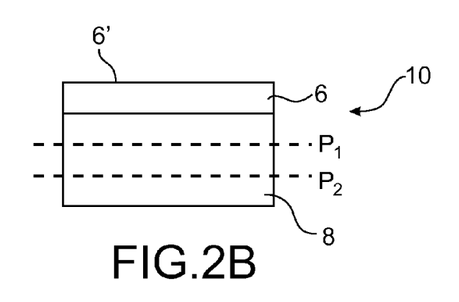

In the case of a substrate of the type having a dielectric layer on a substrate, which is made of a semiconductor material, for example, FIG. 2A shows a schematic representation of double implantation by a beam 4, and FIG. 2B shows the result of this double-implantation step. References 6 and 8 designate, respectively, a dielectric layer, e.g., of $SiO_2$ and substrate made of a semiconductor material, e.g., made of silicon.

The two planes P1 and P2 can be produced with depths having an aspect ratio defined between therebetween (in the case of $H^+$ and $H_2^+$ ions, a ratio close to 2).

Another solution for achieving simultaneous implantation of one element, e.g. hydrogen, at two different depths, is to use the energy contamination phenomenon, which is present in all implanters where there is post-acceleration or post-deceleration. This phenomenon is generally detrimental to the process. It is due to the neutralization of a portion of the beam between the mass-sorting magnet 208 and the acceleration or deceleration column 210 of the implanter (FIG. 6). Thus, the neutralized portion of the beam is implanted at the extraction energy whereas the remainder is implanted at the desired final energy (=extraction energy±acceleration or deceleration energy). For example, a global energy at 100 keV, with 50 keV extraction and 50 keV post-acceleration, results in two implantation planes corresponding to the two energies, 50 keV and 100 keV. This type of method enables two implantation planes to be produced, such as P1 and P2, at two depths independent of one another, and can be carried out with standard commercial implanters.

In the case of implantation of $H^+$ and $H_2^+$ ions, the dose of each of the two implantation planes P1 and P2 is controlled by the composition of the plasma in the source. In the case of a hydrogen source gas, this control is exercised by controlling the currents (or doses) of $H^+$ and $H_2^+$, respectively, either by optimization of the source (e.g., by changing the source parameters to favour one species), or by the controlled addition of other elements to the source, which favour the production of one species over the other. For example, the addition of water promotes the production of $H^+$.

In the case of a neutralization of certain ions, the dose of each of the implantation planes is controlled by the neutralization itself.

An operation for neutralizing a portion of the beam can be influenced by the quality of the vacuum in the machine. Therefore, (optionally in combination with one of the preceding methods) it is also possible to control the proportion of ions implanted at n (e.g., n=2) various desired depths by controlling the quality of the vacuum, prior to the acceleration or deceleration column, either by regulating the pump power, or by introducing a controlled quantity of a gas, by means of a valve, e.g., at the level indicated by the arrow 216 in FIG. 6, between the output of the magnetic means 208 and the acceleration column 210.

It is also possible to neutralize a portion of the beam by applying a negative charge beam ("electron shower" type of device), which, for example, is applied between the magnet 208 and the acceleration column 210. In this way, control is likewise obtained over the respective doses in each of the implantation planes.

In the cases described above, the doses of $H^+$ ions typically fall between $4.10^{16}$ cm$^{-2}$ and $1.10^{17}$ cm$^{-2}$. For the $H_2^+$ species, they are divided by two, and thus the doses of $H_2^+$ ions typically fall between $2.10^{16}$ cm$^{-2}$ and $5.10^{16}$ cm$^{-2}$.

In order to well control the plane along which cleavage will occur first, it is possible to implant additional ions ($H^+$ or $H_2^+$ or $He^+$ or $He^{2+}$), after or before the mixed implantation operation. In other words, once planes P1 and P2 have been defined, it is possible to modify the cleavage kinetics (in particular by controlling the doses) at the level of one or both of these planes, by carrying out another implantation (single or multiple) in order to add other species or to input additional ions, at the level of the P1 and/or P2 planes. It is further possible to change the source gas, if the implantation of hydrogen is not desired.

According to another mode, it is likewise possible to carry out a mixed implantation of a first family of ions ($He^+$, for example) and a second family of ions ($H^+$, for example). By manipulating the initial energy, 2 generated planes are positioned as desired, with a desired and accurate offset. When it is desired to cause 2 types of ions to coexist on or about a single cleavage plane, it is advantageous to not superimpose the two species exactly, but to separate them slightly by implanting one slightly deeper than the other. To accomplish this, here again the energy and the dose of the various species is manipulated. Any type of species may be suitable for these multiple implantation steps.

According to another alternative, the cleavage planes can be defined by several successive (and no longer simultaneous) implantation steps.

According to yet another alternative, rather than sorting the 2 species by mass at the implantation system level, it is possible to carry out a single gas source ionization operation, without mass sorting. In the case of a hydrogen source, this solution likewise results in the simultaneous generation of $H^+$ or $H_2^+$ ions (among others). All of the ionic species generated in the plasma are then implanted simultaneously. A difference should be noted with those of the preceding alternatives, which implement an implanter with mass sorting of the ions. In the implanter implemented here, all of the ions contained in the plasma are extracted directly, and can therefore collide with the target (the substrate). All of the ions then a single initial energy, however, since the masses thereof are different, they will become implanted at different depths.

In the above-mentioned alternatives, where one of the two cleavage kinetics is adjusted by implanting a third species, the ranges can be much broader than those already indicated previously. Typically, for an $H^+/He^+$ pair, the global doses, respectively, are between:

$2.10^{16}$ and $5.10^{16}$ ions $H^+$ cm$^{-2}$, $2.10^{16}$ and $5.10^{16}$ ions $He^+$ cm$^{-2}$.

Hereinafter, certain substrates are assembled by adhesive contact, in particular by bonding or by molecular bonding. These techniques are described in particular by Q. Y. Tong in "Silicon Wafer Bonding Technology for VLSI and MEMS applications", Edited by S. S. Iyer and A. J. Auberton-Hervé, 2002, INSPEC, London, Chapter 1, pages 1-20. Bonding can be ensured, in particular, by an intermediate layer which is deposited on one or both of the two surfaces being assembled, e.g., a layer of resin, or a layer of polymer or any other adhesive layer.

Prior to an assembly such as this, steps for preparing the surfaces being glued can be carried out, such as one or more chemical and/or mechanical treatment (e.g., polishing), and/or cleaning and/or plasma processing and/or ozone treatment steps, in order to favour high-energy bonding.

A heat treatment can next be applied with a view to strengthening the bonding interface. Depending on the nature of the substrates present, the heat treatment can be carried out at between 200° C. and 1200° C., for a few tens of minutes to a few hours, for example between 10 min or 30 min and 3 h or 5 h or 10 h.

The Smart-Cut® process is likewise mentioned in this description. It is described, for example, in the article by B. Aspar and A. J. Auberton-Hervé in "Silicon Wafer Bonding Technology for VLSI and MEMS applications", edited by S. S. Iyer and A. J. Auberton-Hervé, 2002, INSPEC, London, Chapter 3, pages 35-52.

After the above-described implantation operations, it is next possible to proceed with any other operation, and particularly with transferring a first film by cleaving along either of the planes P1, P2.

The condition of the free surface 6' (FIG. 2B) can be pre-modified in order to adapt the properties of this surface being assembled with a first receiving substrate 12 (roughness, flatness, hydrophily, etc.). It is also possible to deposit a surface layer in order to improve these properties. However, it is then preferably to carry out all of these treatments at a low temperature (e.g. at least <500° C. for short periods of time, typically less than 60 min), so as to limit maturing of the cleavage at the level of planes P1 and P2, which cleavage should only occur afterwards.

Figure 3A:
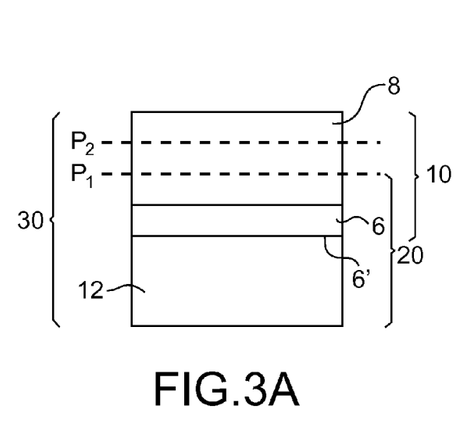
FIGS. 3A and 3B show two steps of a method according to the invention, with a view to transferring a first layer.

FIG. 3A shows the assembly of a substrate 10 of the type like that obtained in FIG. 2B, with a first receiving substrate 12 which is made of Si, for example.

Figure 3B:
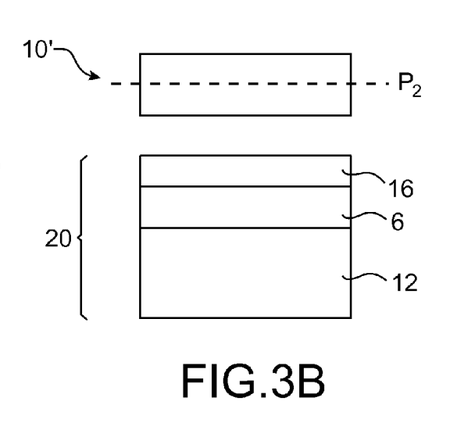

Next, a cleavage occurs along plane P1, which is the shallowest one in the implanted substrate and therefore the closest one to the surface 6' assembled with the receiving substrate 12. This cleavage is produced according to the above-mentioned techniques, in particular according to the SmartCut™ technology (FIG. 3B). Thus, a film 16 is detached from the initial substrate, along plane P1. Based on the implantation dose and the implantation energy for each of the ions implanted, it is possible to carry out a heat treatment enabling cleavage or detachment or fracture along plane P1, without cleaving or fracturing along plane P2.

The rest 10' of the initial substrate 10, which comprises at least plane P2, or a plurality of embrittlement planes (which are initially more distant than P1 from the surface 6' assembled with the receiving substrate 12) can then be prepared again with a view to being assembled or bonded together with a second receiving substrate 22, according to one of the alternatives already described above.

The condition of the free surface of the remaining portion 10' (containing plane P2) can be pre-modified in order to adapt the properties of this surface being assembled with this second receiving substrate 22 (roughness, flatness, hydrophily, etc.). It is also possible to deposit a surface layer in order to improve these properties. However, it is then preferable to carry out all of these treatments at a low temperature (e.g. at least <500° C. for short periods of time, typically less than 60 min), so as to limit maturing of the cleavage at the level of plane P2, which cleavage should only occur afterwards.

Figure 4A:
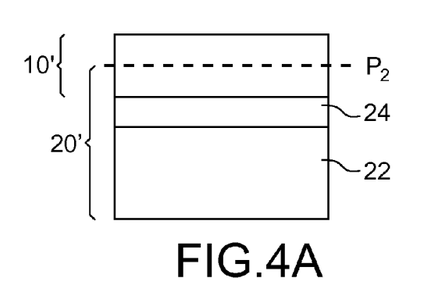
FIGS. 4A and 4B show two steps of a method according to the invention, with a view to transferring a second layer.

FIG. 4A shows the assembled state of the remaining portion 10' and the second receiving substrate 22. This time, the receiving substrate 22 preferably comprises an electrical insulating layer 24. A portion of this layer can have been formed on portion 10'.

Figure 4B:
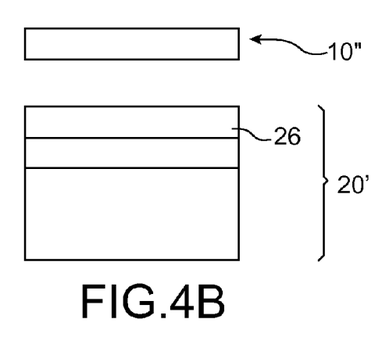

After this assembly operation, cleavage is initiated along plane P2, which makes it possible to detach a second portion 10" from the initial substrate (FIG. 4B).

Thus, a film 26 is detached from the initial substrate, along plane P2, which film remains assembled together with the second substrate 22 via layer 24, and forms the assembly designated by reference 20'.

If one or more other cleavage planes are still present in the remaining portion 10", another assembly operation with a third receiving substrate can be carried out. After this assembly operation, cleavage is again initiated along the embrittlement plane, or along one of the embrittlement planes of the remaining portion, which makes it possible to detach yet another portion of the initial substrate.

In all, for an initial substrate 10 in which n embrittlement planes have been produced, there are n (or n', with 0<n'<n) cleavages and thus n (or n', with n'<n) transfers onto n (or n', with n'<n) receiving substrates which can be produced.

In the example shown of two embrittlement planes P1 and P2, an SiO2 layer 6 and a silicon substrate 8:
 a first silicon-on-insulator (SOI) type of structure 20 is obtained for an Si substrate 12,
 an $SiO_2$ layer 24 is obtained for an Si substrate 22, thus resulting in a second silicon-on-insulator (SOI) type of structure (layer 26 is made of Si since the substrate 8 is also made of Si).

Consequently, a step of implanting multiple species enables the obtainment of several nearly identical SOI structures, or more generally speaking, several transfers of individual thin layers, each being transferred onto a different substrate from that onto which the other individual thin layers are transferred.

Figure 5A:
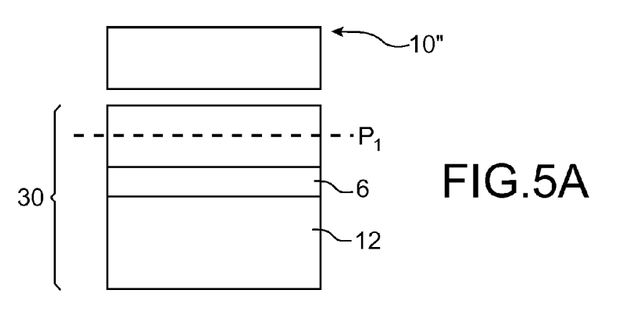
FIGS. 5A to 5C show steps of a method according to the invention with a view to transferring a first and a second layer.

The operations just described can be carried out in another order. Thus, as shown in FIG. 5A, and starting with the structure of FIG. 3A, a first cleavage is made along plane P2, which is the deepest one in the implanted substrate and therefore the one furthest from the surface 6' assembled with the receiving substrate 12, instead of a first cleavage along plane P1, which is the shallowest one in the implanted substrate and therefore the one closest to the surface 6' assembled with the first receiving substrate 12. The implantation dose and implantation energy parameters will have been chosen so as to make it possible to cleave along P2, without cleaving along P1.

The structure 30 of FIG. 5A is thus obtained, in which the portion assembled together with the receiving substrate comprises a cleaving plane P1.

This new structure 30, which results from the assembly with the receiving substrate 12, can then be prepared again, with a view to being assembled or bonded together with a second receiving substrate 32, according to one of the alternatives already disclosed above.

The surface condition of structure 30 can be pre-modified in order to adapt the properties of this surface being assembled with substrate 32 (roughness, flatness, hydrophily, etc.). It is also possible to deposit a surface layer in order to improve these properties. However, it is then preferably to carry out all of these treatments at a low temperature (e.g. at least <500° C. for short periods of time, typically less than 60 min), so as to limit maturing of the cleavage at the level of plane P1, which cleavage should only occur afterwards.

Figure 5B:
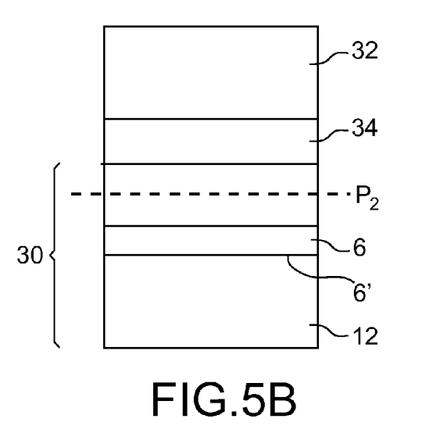

FIG. 5B shows the assembled state of structure 30 and this substrate 32. The second receiving substrate 32 preferably comprises an electrical insulating layer 34. The latter may have also been partially formed on structure 30.

Figure 5C:
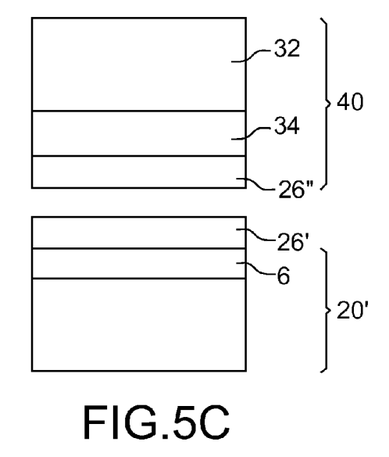

After this second assembly operation, cleavage is initiated along plane P1, which makes it possible to detach a first portion 20' and second portion 40, each comprising a transferred layer 26', 26" (FIG. 5C).

Thus, a film 26' is detached from the initial substrate, along plane P1.

If one or more other cleavage planes are still present in one of portions 20', 40, another assembly operation with a third receiving substrate can be carried out. This assembly operation can be followed by cleaving along one of these cleavage planes.

Here again, in all, for a substrate 10 in which n embrittlement planes have been made, there are n (or n', with n'<n) cleavages and thus n (or n', with n'<n) transfers onto n (or n', with n'<n) various receiving substrates which can be carried out.

For an Si substrate 32, an $SiO_2$ layer 34, an initial silicon substrate 8 (thus a film 26 or a thin silicon layer), an $SiO_2$ layer 6, two silicon-on-insulator (SOI) type of structures 20', 40 (FIG. 5C) are obtained by cleaving along P1.

The above-described assembly methods can be carried out with any substrate 2 (FIG. 1), and any number of embrittlement planes, in any order. It is therefore possible to use methods which combine the method described in connection with FIGS. 3A and 3B and that described in connection with FIGS. 5A to 5C.

The invention claimed is:

1. A method of implanting at least one of atoms or ions into a substrate, comprising:
 a) performing a first implantation of ions or atoms at a first depth in the substrate, to form a first cleavage zone; and
 b) performing at least one second implantation of ions or atoms at a second depth in the substrate, which is different from the first depth, to form at least one second cleavage zone, the second cleavage zone being produced simultaneously with the first cleavage zone, wherein the steps a) and b) are performed simultaneously.

2. The method as claimed in claim 1, wherein the steps a) and b) are carried out across a same face of the substrate.

3. The method as claimed in claim 1, wherein
the first implantation is an implantation of first ions, having a first mass, and
the at least one second implantation is an implantation of second ions having a second mass which is different from the first mass.

4. The method as claimed in claim 3, wherein
the first implantation is an implantation of $H^+$ ions, and
the second implantation being is an implantation of $H_2^+$ ions.

5. The method as claimed in claim 1, wherein
the first implantation is an implantation of atoms, and
the second implantation is an implantation of ions.

6. The method as claimed in claim 5, wherein the atoms are implanted with a first output energy of an implantation device, and the ions are implanted with a second output energy of the implantation device.

7. The method as claimed in claim 6, wherein the atoms are obtained by neutralizing a first portion of an ion beam, which thus receives a first implantation energy, and the second portion of the ion beam is accelerated or decelerated in relation to the first portion of the ion beam and thus having a different implantation energy from the first implantation energy.

8. The method as claimed in claim 6, wherein a proportion of elements implanted at the first implantation energy and the second implantation energy is obtained by controlling quality of a vacuum prior to an acceleration or deceleration column, by regulating pump power or by introducing a controlled quantity of a gas, or else by beam-charge neutralization of a portion of species contained in an implantation beam.

9. The method as claimed in claim 1, wherein the first implantation and the at least one second implantation are carried out without mass sorting, and all of species generated in a plasma are then implanted simultaneously.

10. The method as claimed in claim 1, wherein the first implantation and the at least one second implantation are carried out with mass sorting or double mass sorting, in an ion implantation device.

11. The method as claimed in claim 1, further comprising:
implanting additional ions, at the first or second implantation depth, at least one of prior to or after the first implantation and the at least one second implantation to carry out an additional ion input, or to add a species of ions which is different from ions or atoms of the first implantation or the at least one second implantation.

12. A method of transferring at least one layer from a substrate onto at least one first receiving substrate, comprising:
a') the method of implanting at least one of atoms or ions into the substrate, according to claim 1, thereby forming an implanted substrate with at least two cleavage zones;
b') assembling the implanted substrate and the at least one first receiving substrate; and
c') cleaving of the implanted substrate along one of the cleavage zones.

13. The method according to claim 12, wherein the cleaving c') leaves a portion of the implanted substrate free, in relation to the at least one first receiving substrate, which comprises at least one cleavage zone.

14. The method according to claim 13, further comprising:
d') transferring the portion of the implanted substrate, which remained free, onto a second receiving substrate.

15. The method according to claim 14, further comprising:
e') cleaving the portion of the first implanted substrate which remained free, along one of the cleavage zones thereof.

16. A method according to claim 12, further comprising:
before or after the cleaving c'), assembling the implanted substrate, which was assembled with the at least one first receiving substrate, with a second receiving substrate.

17. The method according to claim 12, wherein the cleaving c') leaves a portion of the implanted substrate on the at least one first receiving substrate, which comprises at least one cleavage zone.

18. The method according to claim 12, wherein a plurality of SOI substrates are produced from the substrate in which a plurality of cleavage zones have been produced, by transferring onto a plurality of receiving substrates.

19. A method of transferring at least two layers from a substrate onto at least a first receiving substrate and a second receiving substrate, comprising:
A) implanting at least one of atoms or ions into the substrate, the implanting including,
a) performing a first implantation of ions or atoms at a first depth in the substrate, to form a first implantation zone, and
b) performing at least one second implantation of ions or atoms at a second depth in the substrate, which is different from the first depth, to form at least one second implantation zone, the first and said second implantation zones being produced by implantation across a same face of the substrate;
B) assembling the implanted substrate and a first receiving substrate, then cleaving the implanted substrate along one of the first implantation zone or the at least one second implantation zone, the cleaving leaving a first portion of the implanted substrate free, in relation to the first receiving substrate, which further comprises at least one implantation zone; and
C) assembling the first portion of the implanted substrate, which comprises at least one implantation zone, and one second receiving substrate, and then cleaving along one of the implantation zones of the first portion of the implanted substrate.

20. The method according to claim 19, wherein the assembling C) leaves a second portion of the implanted substrate free in relation to the second receiving substrate, which further comprises at least one implantation zone and the assembling C) is followed by:
D) assembling the second portion, which further comprises at least one implantation zone, and a third receiving substrate, followed cleaving along one of the implantation zones of the second portion of the implanted substrate.

21. The method as claimed in claim 19, wherein a plurality of SOI substrates are produced from the implanted substrate in which a plurality of embrittlement planes have been produced, by transferring onto a plurality of receiving substrates.

* * * * *